United States Patent [19]

Brady et al.

[11] Patent Number: 5,634,028

[45] Date of Patent: May 27, 1997

[54] COMPACT TRACK ADDRESS TRANSLATION MAPPING SYSTEM AND METHOD

[75] Inventors: James T. Brady, San Jose; Robert W. Shomler, Morgan Hill; May N. Wone, San Jose, all of Calif.

[73] Assignee: International Business Machines Corporation, Armonk, N.Y.

[21] Appl. No.: 356,696

[22] Filed: Dec. 15, 1994

[51] Int. Cl.⁶ .......................... G06F 12/02; G06F 12/10
[52] U.S. Cl. ...................... 395/404; 395/412; 395/421.11
[58] Field of Search ...................... 395/404, 412, 395/421.11

[56] References Cited

U.S. PATENT DOCUMENTS

| | | | |
|---|---|---|---|
| 4,207,609 | 6/1980 | Luiz et al. | 395/858 |
| 4,499,539 | 2/1985 | Vosacek | 395/600 |
| 4,750,106 | 6/1988 | Aiken, Jr. | 395/182.03 |
| 4,882,642 | 11/1989 | Tayler et al. | 360/78.11 |
| 5,095,420 | 3/1992 | Eilbert et al. | 395/419 |
| 5,193,184 | 3/1993 | Belsan et al. | 395/404 |
| 5,247,638 | 9/1993 | O'Brien et al. | 395/888 |
| 5,263,145 | 11/1993 | Brady et al. | 395/441 |
| 5,283,884 | 2/1994 | Menon et al. | 395/440 |
| 5,301,286 | 4/1994 | Rajani | 395/412 |
| 5,546,557 | 8/1996 | Allen et al. | 395/404 X |
| 5,555,307 | 9/1996 | Fujii et al. | 395/404 X |

OTHER PUBLICATIONS

Enterprise Systems Journal—Nov. 1993 "Realtime DASD Data Copy For Disaster Recovery" pp. 92–100 by Robert Shomler.

*Primary Examiner*—David L. Robertson
*Attorney, Agent, or Firm*—Ohlandt, Greeley, Ruggiero & Perle

[57] ABSTRACT

A computer-implemented method for translating from one DASD address to another DASD address initially stores a plurality of translation tables, one translation table for each first DASD coupled to a first processor. Each translation table includes at least a first data value for each cylinder in a first DASD which indicates whether or not the cylinder contains a start-of-extent address. If yes, the translation table has a corresponding translation entry which includes a first portion and a second portion. The first portion includes at least the start-of-extent address in the cylinder and a length of the extent of addresses associated with the start-of-extent address. The second portion includes a start-of-extent address for an address span in a second DASD that corresponds to the first portion. The method further determines, in response to receipt of an address in the first DASD (and from an associated DASD translation table), whether a cylinder identifier in the received address is associated with a first data value in the translation table that indicates a presence of a start-of-extent value. If yes, the method finds a corresponding translation entry and from a second portion thereof, determines an address in the second DASD that corresponds to the received first DASD address.

10 Claims, 3 Drawing Sheets

5,634,028

COMPACT TRACK ADDRESS TRANSLATION MAPPING SYSTEM AND METHOD

FIELD OF THE INVENTION

This invention relates to a method and apparatus for storing duplex copies of data in separate direct access storage devices (DASDs) and, more particularly, to a highly compact translation method and apparatus that enables a received address space in one DASD to be translated to a corresponding address space in another DASD.

BACKGROUND OF THE INVENTION

There are a number of circumstances when an address to one volume of DASD memory requires a translation to a second address of another volume of memory on a separate DASD. Disaster protection systems implement a remote dual copy procedure wherein each reference to a primary DASD volume is duplicated by a relatively concurrent reference to a secondary DASD volume that is remote from the primary DASD. Remote in this context means at whatever distance will offer immunity from a disaster at the primary DASD location. Because system users require that the process of duplexing data not impact applications performance, an asynchronous copy procedure is implemented—as contrasted to a synchronous copy procedure. A synchronous copy procedure is one in which data is sent to a secondary DASD location and its entry therein is confirmed prior to ending the input/output operation at the primary DASD. An asynchronous procedure occurs when the input/output primary operation at the primary DASD is allowed to complete before data is confirmed to have been stored at the secondary DASD location. In performing such a copy procedure, address translation must be performed so that when an address is received for a primary DASD memory volume, an address for a secondary DASD memory volume can be found which corresponds to the primary DASD memory volume. Classically, translation tables have been used to perform such address references, however they have occupied large areas of memory due to the large volumes of stored data.

Requirements for continuous real-time data duplexing also occur when sending updated data from a primary DASD to a secondary DASD as a continuous stream. When such data is identified by its primary DASD address (e.g. device, cylinder and track), the secondary DASD must perform a continuous translation of the primary DASD addresses to secondary DASD addresses. Continuous translation of DASD addresses is also a requirement in systems that implement virtual volumes where the actual memory address at which data is stored is different from the address which requesting software uses to identify a particular track. While the art is replete with schemes for effecting different types of address translation, each procedure requires a tradeoff between the amount of translation table memory and the speed of lookup in the translation tables.

Accordingly, it is an object of this invention to provide an improved method and system for enabling translation of a set of DASD addresses in a first DASD volume to a set of addresses in a second DASD volume.

It is another object of this invention to provide an improved DASD address translation procedure which is highly efficient in use of memory space.

It is yet another object of this invention to provide a DASD address translation method and system which exhibits a high speed translation capability.

SUMMARY OF THE INVENTION

A computer-implemented method for translating from one DASD address to another DASD address initially stores a plurality of translation tables, one translation table for each first DASD coupled to a first processor. Each translation table includes at least a first data value for each cylinder in a first DASD which indicates whether or not the cylinder contains a start-of-extent address. If yes, the translation table has a corresponding translation entry which includes a first portion and a second portion. The first portion includes at least the start-of-extent address in the cylinder and a length of the extent of addresses associated with the start-of-extent address. The second portion includes a start-of-extent address for an address span in a second DASD that corresponds to the first portion. The method further determines, in response to receipt of an address in the first DASD (and from an associated DASD translation table), whether a cylinder identifier in the received address is associated with a first data value in the translation table that indicates a presence of a start-of-extent value. If yes, the method finds a corresponding translation entry and from a second portion thereof, determines an address in the second DASD that corresponds to the received first DASD address. By employing a bit map to identify which cylinders in a first DASD include a start-of-extent address and then only storing the start-of-extent address and a length of the extent, substantial data compaction is achieved. A further bitmap indicates which cylinders are further segmented by track and enable address translation for such segmented cylinders.

DETAILED DESCRIPTION OF THE INVENTION

This invention makes use of the fact that data duplexing systems generally operate on sets of data which comprise substantial length data runs. Each data set thus comprises an initial address followed by many data entries at succeeding, contiguous addresses. Each data set is thereby defined by an initial address and an extent value which defines the number of addresses comprising the data set. When compared to the actual number of addresses in a DASD, the number of data sets is "sparse" in comparison. Put another way, tracks of data that are duplexed are composed of sets of contiguous track addresses, which sets are sparse within the total DASD address space. This sparseness enables the memory-efficient table-type address translation structure employed herein.

When data is being duplexed, the address translation structure must exhibit dynamic flexibility, in that the choice of tracks being duplexed from a source DASD may change often during any time interval, which change occurs as jobs start and complete—creating, extending, and deleting data sets. Changes also occur due to a source DASD system's storage manager performing data set reorganization on the source DASD, causing changes in the sets of source DASD track addresses assigned to data sets.

The translation data structure employed in this invention accepts a source DASD track address and returns a result value which is either a target DASD track address value or an indication that no target address has been provided for the source DASD track address. Source (and target) DASD track addresses, assuming a count, key, data track format address model, are composed of a DASD index number (D) of from 1 to N, a cylinder number (C) ranging from 0 to M within each DASD and a "head" or track number (H) ranging from 0 to J within each cylinder. Thus, in the description below, a DASD track address is represented by "DDCCH", where each letter represents an 8-bit byte. DD identifies up to 65,000 DASDs, an arbitrary upper value; CC identifies up to 65,000, cylinders on each DASD (wherein the typical value today is several thousand); and H provides for addressing of up to 256 tracks per DASD cylinder (a typical number today is 15 tracks per cylinder).

Those skilled in the art will realize that the described track address format is provided for exemplary purposes and that other track formats are equally usable with this invention. Further, the description to follow will consider the case wherein data is being duplexed across at least a pair of remotely positioned DASDs for disaster recovery purposes. This is merely for exemplary purposes to describe the invention and it is to be understood that the translation addressing method and apparatus, to be hereafter described, are applicable to substantially any environment that requires DASD address translation.

Figure 1:
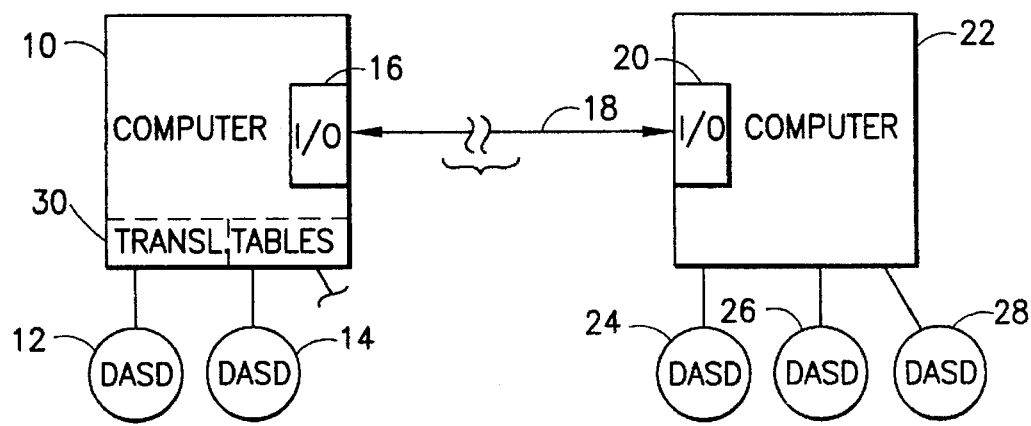
FIG. 1 is a high level block diagram of two computer systems, with connected DASDs, that implements the invention.

Referring to FIG. 1, a computer 10 includes a plurality of connected DASDs 12, 14, etc. to which data is continually being written and from which data is continually being read. To assure recoverability of the data in the event of a failure of computer 10, the data is duplexed and further transmitted, via an I/O interface 16 and datalink 18, to an I/O interface 20 for computer 22. Computer 22, given a received address in one of DASDs 24, 26, or 28 stores the received duplex data at the indicated DASD address received over datalink 18. A plurality of translation tables 30 are present in computer 10 and enable rapid translation of a span of data addresses in DASDs 12 or 14 to a span of data addresses within one of DASDs 24, 26, or 28. There is one translation table 30 for each DASD 12, 14 that is connected to computer 10.

Figure 2:
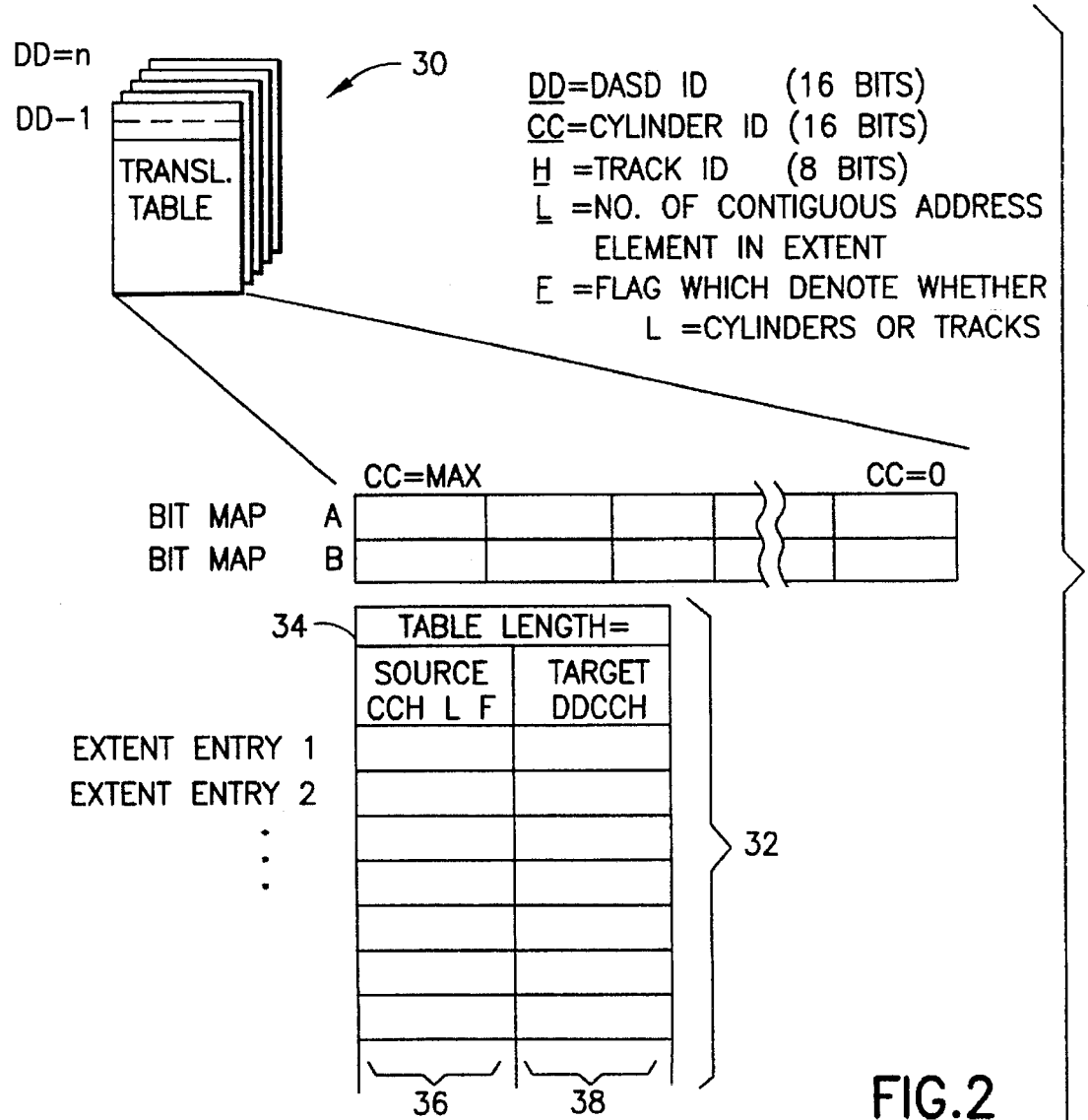
FIG. 2 is a schematic diagram which illustrates the structure of a translation table provided for each primary DASD in FIG. 1.

The structure of translation tables 30 is shown schematically in FIG. 2. If it is assumed that there are n DASD devices connected to computer 10, translation tables 30 will comprise n separate translation tables, DD=1 through DD=n (one for each DASD). Each translation table is identical in structure, includes two bitmaps A and B and an extent table 32. Bitmap A has one bit for each cylinder in the associated DASD, sequenced so that bit 0 in the bitmap corresponds to the highest numbered cylinder address value (CC=M) and a bit M in the bitmap that corresponds to a cylinder address CC=0. A "1" bit in bitmap A indicates, for the corresponding cylinder, that there is a start-of-extent entry in extent table 32 for that cylinder. In other words, the respective cylinder includes an address where the first data entry of a data set resides.

If there is no start-of-extent entry in bitmap A, then there is no start-of-extent entry in extent table 32, indicating that data stored in that cylinder commences at a start address on some other cylinder. Bitmap A (and bitmap B) are each ordered to facilitate rapid bitmap scanning in decreasing CC-value order (to be more fully understood from the description below).

Bitmap B is mapped congruently to bitmap A and has a bit set=1 if a corresponding bit in bitmap A is set to 1 and the extent of addresses of the data set is not a multiple of whole cylinders. Thus, when a start address in extent table 32 is at the beginning of a cylinder and the entire cylinder is allocated to one extent, then the bit position in bitmap B representing the cylinder address is set equal to zero. This setting means that all track values (H) in the cylinder are valid and a target address value may be directly accessed without further processing from extent table 32.

Extent table 32 comprises a table length value 34 and two series of independent, linked, entries 36 and 38. Each entry 36 defines a track address (CCH) that is a start-of-extent address for a data set recorded in the source DASD. A source DASD entry 36 further includes a value "L" which defines the number of additional contiguous address elements that comprise the data set whose start address value is equal to CCH. A further value "F" defines whether "L" denotes either cylinders or tracks. The "F" entry comes into play when a value in bitmap B is set equal to 1.

Each target entry 38 in extent table 32 includes a track address (DDCCH) in a target DASD that corresponds to a linked extent entry 36. To find a track address in a target DASD that corresponds to a source DASD track address, the translator process uses the value DD in the source DASD address to index to an appropriate translation table 30. The procedure then uses the value CC in the source DASD address to index to the corresponding bit position in bit map A and determines the state of that bitmap position. At the same time, the corresponding position in bitmap B is read, yielding two bits A' and B' where A' is the bit value from bitmap A and B' is the value from bitmap B. As above indicated, when A' is equal to 1, the cylinder includes a start of extent address. When B' is equal to 1, that cylinder is not entirely allocated to a single extent of addresses.

When A' and B' are set to 1 and 0, respectively, the translation procedure (as performed by computer 10) searches extent table 32 to find a source entry 36 which has a track address CCH value that matches the CCH track address portion of the source DASD address. That search is associative as there are relatively few entries in extent table 32. Upon finding a match, the linked target DASD device address is known to be valid for all values of H. Under these circumstances the values of L and F in source extent entry 36 are ignored as it is known that the entire cylinder is devoted to a single data set of contiguous addresses.

When A' and B' are both set to 1, then the cylinder address (CC) is determined from the source DASD address (DDCCH). A corresponding start-of-extent address CCH of equal value is found among source entries 36 in extent table 32. More specifically, the H value of the source DASD address is tested against the H value of the CCH source address in source entry 36 (whose CC value matches the source DASD address CC value). If the source address H value is not less than the value H from source entry 36 and is not greater than the value H plus length L from source entry 36, then the found source entry 36 identifies an extent of track addresses which contains the target track value CCH. The corresponding target track address value H is determined by subtracting the value H in source entry 36 from the H value of the source DASD address track value H. The difference is added to the corresponding DASD address H value in target entry 38.

If the source DASD track address H is less than the value H in source entry 36, or is greater than that value H plus length L, then a next entry in source entry 36 for source cylinder address CC is accessed and the aforedescribed test is repeated until an entry is found whose H values include the source address H value. When A' is 0 and B' is either 0 or 1, bitmap A is scanned in sequence of increasing offset from A' (towards a bit which represents CC=0). When the first non-zero bit value is found, the bitmap index of this non-zero value is identified and the source DASD address cylinder value CC is then subtracted from the thus-found bitmap index to yield an offset value S. S is then subtracted from the source DASD cylinder value CC to yield a new source cylinder address CC'. CC' is used to locate a source entry 36 for the A' value=0 described above. The target address CC value is obtained by adding the offset value S to the target DASD cylinder address value CC that is determined from target entry 38 for CC'. The value H from the source value address H is used for the target DASD H address value when the bit value in B is set to 0. The target DASD track address value H must be calculated when the value in bitmap B is set to 1.

Figure 3:
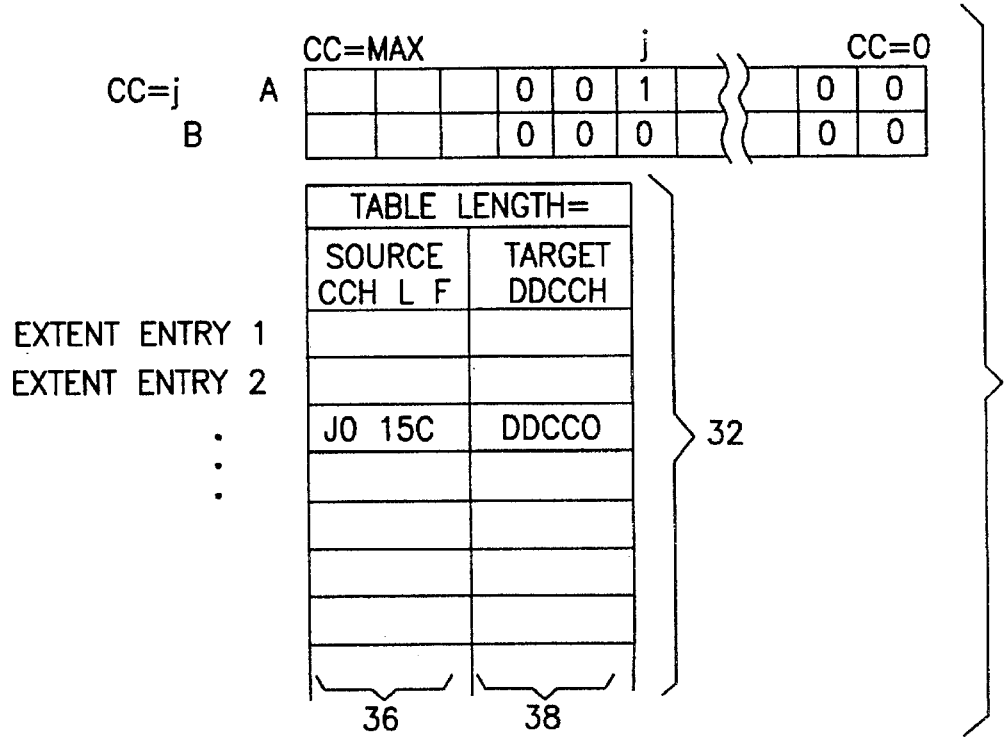
FIGS. 3–5 are translation tables with entries that illustrate the handling of certain types of track addresses.
Figure 4:
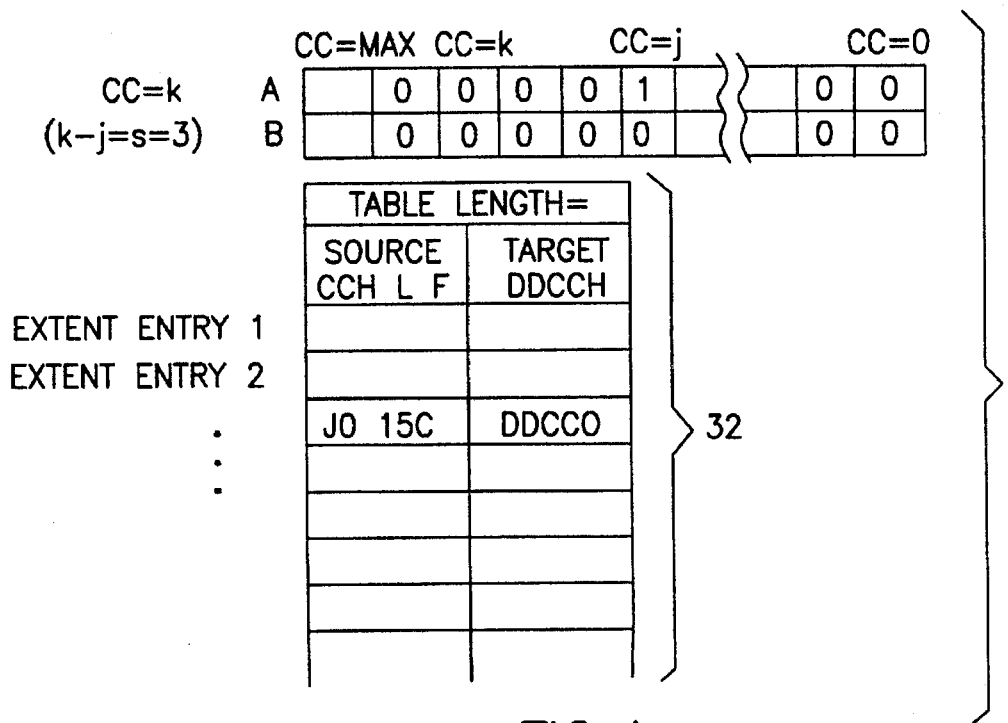
Figure 5:
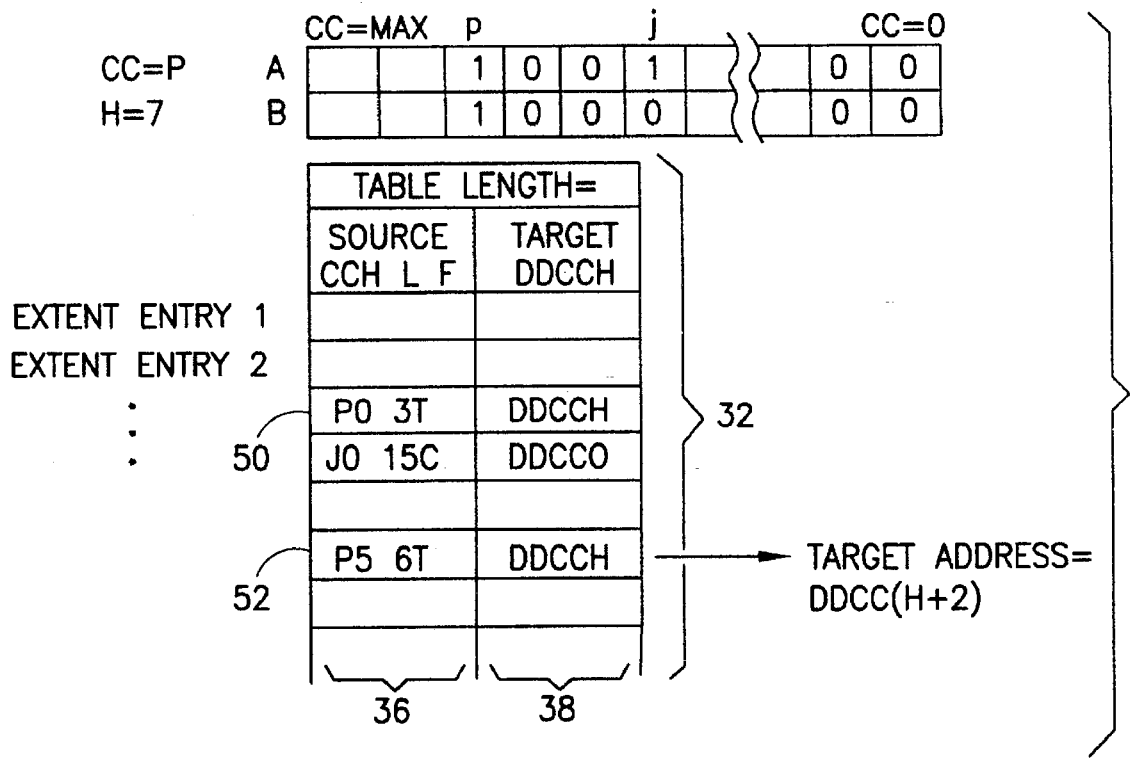

The examples shown in FIGS. 3–5 will enable a more complete understanding of the invention. Turning first to FIG. 3, assume that the cylinder value CC is set to j in the source DASD address. Under such condition, the translation table 30 associated with the source DASD device number DD is accessed and bitmap A is searched until the bit position corresponding to cylinder j is found. Since the bit value at position j is set equal to 1, it is known that cylinder j includes a start of extent address therein. Furthermore, since the corresponding bit position in bitmap B is set to 0, it is known that all values of H within the j cylinder are valid.

Accordingly, the procedure moves to extent table 32 and begins an associative search of source entries 36. When an entry having a CC value equal to J is found, the associated H value is ignored as it is already known that all values of H are valid. Thus, the initial track in the cylinder whose CC value equals J is the beginning address of the extent. The L entry indicates a length "15" which, when combined with the F entry wherein the C value denotes cylinders, further indicates that the extent of the data set is 16 cylinders. The procedure then outputs the target entry 38 of DDCCO which is the corresponding target DASD address. The final 0 in DDCCO indicates that the initial track in the target cylinder CC is the one where the extent starts.

Turning to FIG. 4, assume the same entry states in bitmaps A and B as in FIG. 3, but, that (1) the source DASD address includes a cylinder value CC=K, and (2) the k'th position in bitmap A is 0, indicating that no start of extent address is present in that cylinder CC. As a result, the procedure searches to the right in bitmap A to find the next lower cylinder address CC where a 1 entry is present. The assumption is that cylinder k may be included as a portion of an entry in extent table 32, but that the initial address that identifies the start of the extent is in a lower valued cylinder CC. In the case shown in FIG. 4, a 1 entry is found in the jth position of bitmap A and the corresponding entry in bitmap B is 0.

The procedure then moves to extent table 32 wherein an associative search finds the j cylinder value entry as described above for FIG. 3. An offset value S is calculated between cylinder addresses k and j, and as they are three-bit positions apart, the offset values is equal to 3. The value S (3) is then compared against the length entry L=15. As S is less than L, it is known that the source DASD address whose CC value equals k is within the j source DASD extent table entry 36. The corresponding target DASD address entry 38 is accessed and +3 is added to its CC value to arrive at the proper track address within the target DASD. The H value of 0 remains as there is no 1 entry in bitmap B (that would indicate that there are plural start of extent addresses within that cylinder).

In FIG. 5, it is assumed that the source DASD address includes a CC value of p and an H value equal to 7. As before, the procedure searches bitmap A in translation table 30 and finds a 1 entry in the bit position corresponding to p. Thus, it is known that extent table 32 includes an entry which indicates a start of extent address in cylinder CC=p. In this instance, bitmap B also includes a 1 value in the corresponding bit position so it is known that the extent does not encompass all of the cylinder.

Next, extent table 32 is searched and a first source entry 50 for cylinder p is found. Entry 50 indicates a CC value of p; that the initial address of the data set commences at track 0; that the extent length is 4 (the initial track and 3); and that the extent length is in terms of tracks (F=T). Thus, when the extent L (3 tracks) is added to the initial track address of 0, the sum is less than the source DASD track address (H=7). As a result, the search continues down extent table 32 until a next entry 52 for CC=P is found. In this case, the initial track value is 5 and the extent continues for 6 tracks. The initial track value is added to the extent of 6 tracks to find an end track of 11. A comparison then shows that the source DASD track address H=7 falls within the extent of entry 52, but that the initial track position is two tracks later than the initial track address of 5. As a result, when corresponding target entry 38 is accessed, +2 is added to the H value therein to provide the translated track address in the target DASD.

In summary, it can be seen that by arranging the translation table in the form of start of extent address values coupled with a length of extent, that a substantial reduction in translation table size is achieved. Furthermore, through the use of bitmaps A and B, both cylinder and track identities can be established by simple, comparison and arithmetic operations.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. Computer apparatus for translating from one direct access storage device (DASD) address to another DASD address, each DASD address comprising a DASD device identifier (ID), a cylinder ID and a track ID, data being stored on e DASD from a start track and extending for an extent of addresses, comprising:

first processing means including at least one first DASD;

second processing means including at least one second DASD;

means for enabling data communications between said first and second processing means;

memory associated with said first processing means for storing at least one translation table, one translation table for each first DASD coupled to said first processing means, each translation table including at least a first data value for each cylinder in said first DASD which indicates whether a corresponding cylinder contains a start of extent address, and if yes, at least one corresponding translation entry comprising a first portion and a second portion, said first portion including at least said start of extent address and a length of the extent of addresses associated with said start of extent address, said second portion including a start of extent address for an address span in said second DASD that corresponds to said first portion; and logic means in said first processing means and responsive to receipt of a first DASD address to determine from a translation table in said memory that corresponds to said first DASD whether a cylinder ID in said first DASD address is associated with a first data value indicating a presence of a start of extent value and if yes, finding a corresponding translation entry and from a second portion thereof, determining an address in said second DASD that corresponds to said first DASD address.

2. The computer apparatus as recited in claim 1, wherein said logic means, upon finding that said first data value indicates that there is no start of extent address in a cylinder whose cylinder ID is present in said first DASD address, provides a signal indicative of an invalid address.

3. The computer apparatus as recited in claim 1, wherein each said first data value in a translation table for a first DASD is stored in a bit map having one bit position corresponding to each cylinder in the first DASD.

4. The computer apparatus as recited in claim 1, wherein each said translation table further includes a second data value corresponding to each first data value indicating that a corresponding cylinder contains a start of extent address, said second data value having a first value when said start of extent address is at a first track address in said cylinder and a second value when said start of extent address is at an intermediate track address in said cylinder;

said logic means being responsive to a first DASD address and a first data value from a corresponding translation table indicating that a cylinder ID in said first DASD address includes a start of extent address and a corresponding second data value having a second value, to search in said translation table for a translation entry including said cylinder ID and an appended track ID, and upon finding said cylinder ID, arithmetically combining said appended track ID and a track ID from said first DASD address to find an offset value, said offset value being combined with a second DASD address in said second portion of said translation entry to derive a second DASD address corresponding to said first DASD address.

5. The computer apparatus as recited in claim 4, wherein each entry in said translation table further includes an entry extent value, and if said offset value derived for a translation entry exceeds said entry extent value, a next translation entry in said translation table is found and said arithmetically combining operation is repeated until an offset value is found for a translation entry that does not exceed an entry extent value therein.

6. A computer-implemented method for translating from one direct access storage device (DASD) address to another DASD address, each DASD address comprising a DASD device identifier (ID), a cylinder ID and a track ID, data being stored on a DASD from a start track and extending for an extent of addresses, said method comprising the steps of:

(a) storing at least one translation table, one translation table for each first DASD coupled to a first processing means, each translation table including at least a first data value for each cylinder in said first DASD which indicates whether a corresponding cylinder contains a start of extent address, and if yes, at least one corresponding translation entry which includes a first portion and a second portion, said first portion including at least said start of extent address and a length of the extent of addresses associated with said start of extent address, a second portion including a start of extent address for an address span in said second DASD that corresponds to said first portion;

(b) determining, in response to receipt of an address in said first DASD from a translation table in said memory that corresponds to said first DASD, whether a cylinder ID in said address is associated with a first data value indicating a presence of a start of extent value; and if yes, (c) finding a corresponding translation entry and from a second portion thereof, determining an address in said second DASD that corresponds to said address in said first DASD.

7. The method as recited in claim 6, wherein determining step (b), upon finding that said first data value indicates that there is no start of extent address in a cylinder whose cylinder ID is present in said first DASD address, provides a signal indicative of an invalid address.

8. The method as recited in claim 6, wherein each said first data value in a translation table for a first DASD is stored in a bit map having one bit position corresponding to each cylinder in the first DASD.

9. The method as recited in claim 6, wherein each said translation table further includes a second data value corresponding to each first data value indicating that a corresponding cylinder contains a start of extent address, said second data value having a first value when said start of extent address is at a first track address in said cylinder and a second value when said start of extent address is at an intermediate track address in said cylinder; said determining step (b) being responsive to a first DASD address and a first data value from a corresponding translation table indicating that a cylinder ID in said address in said first DASD includes a start of extent address and a corresponding second data value having a second value, to search in said translation table for a translation entry including said cylinder ID and an appended track ID, and upon finding said cylinder ID, arithmetically combining said appended track ID and a track ID from said first DASD address to find an offset value, said offset value being combined with a second DASD address in said second portion of said translation entry to derive a second DASD address corresponding to said first DASD address.

10. The method as recited in claim 6, wherein each entry in said translation table further includes an entry extent value, and if said offset value derived for a translation entry exceeds said entry extent value, a next translation entry in said translation table is found and said arithmetically combining operation is repeated until an offset value is found for a translation entry that does not exceed an entry extent value therein.

\* \* \* \* \*